(12) United States Patent
Lin

(10) Patent No.: US 6,462,944 B1
(45) Date of Patent: Oct. 8, 2002

(54) COMPUTER CABINET COOLING SYSTEM

(75) Inventor: Chun Hsiung Lin, Duluth, GA (US)

(73) Assignee: Macase Industrial Group Ga., Inc., Norcross, GA (US)

( * ) Notice: Subject to any disclaimer, the term of this patent is extended or adjusted under 35 U.S.C. 154(b) by 70 days.

(21) Appl. No.: 09/696,428

(22) Filed: Oct. 25, 2000

(51) Int. Cl.$^7$ ............................................. H05K 5/02
(52) U.S. Cl. ..................... 361/687; 361/688; 361/695; 361/703; 361/694; 454/184; 454/185; 454/186; 165/80.3
(58) Field of Search ............................. 361/687, 688, 361/695, 703, 694; 454/184, 185, 186; 165/121–126, 80.3

(56) References Cited

U.S. PATENT DOCUMENTS

| | | | | |
|---|---|---|---|---|
| 5,467,250 A | * | 11/1995 | Howard et al. | 361/696 |
| 5,793,610 A | * | 8/1998 | Schmitt et al. | 361/695 |
| 6,164,369 A | * | 12/2000 | Stoller | 165/104.33 |
| 6,236,564 B1 | * | 5/2001 | Fan | 361/695 |
| 6,297,950 B1 | * | 10/2001 | Erwin | 361/685 |
| 6,359,779 B1 | * | 3/2002 | Frlank, Jr. et al. | 361/687 |

* cited by examiner

*Primary Examiner*—Darren Schuberg
*Assistant Examiner*—David Foster
(74) *Attorney, Agent, or Firm*—Hinkle & O'Bradovich, LLC

(57) ABSTRACT

A computer cabinet cooling system comprising an upright tower cabinet having a front panel with an equipment bay for holding heat producing components, a lower aperture and a plurality of air openings. A fan unit having a fan plenum is mounted within the lower aperture of the front panel below the equipment bay near the air openings. An inner door is provided having a plurality of air inlet ports, a plurality of air outlet ports, a plurality of spaced apart horizontal air ingress slots and a fan shroud. When the inner door is closed against the front panel, the air outlet ports will align with the air openings in the front panel, the air ingress slots will align with the heat producing components in the equipment bay and the fan shroud will contact the fan unit. An outer door is also provided having an air plenum, a lower orifice with air deflector, and a plurality of spaced apart horizontal air ingress slots. When the fan unit is turned on ambient air will be drawn through the air inlet ports and air outlet ports in the inner door, past the air openings in the front panel, into the fan plenum, out through the fan shroud, past the lower orifice with the air deflector, up through the air plenum in the outer door through the air ingress slots in the outer door, past the air ingress slots in the inner door and into the equipment bay in the front panel to cool the heat producing components in the upright tower cabinet.

4 Claims, 4 Drawing Sheets

Fig_1

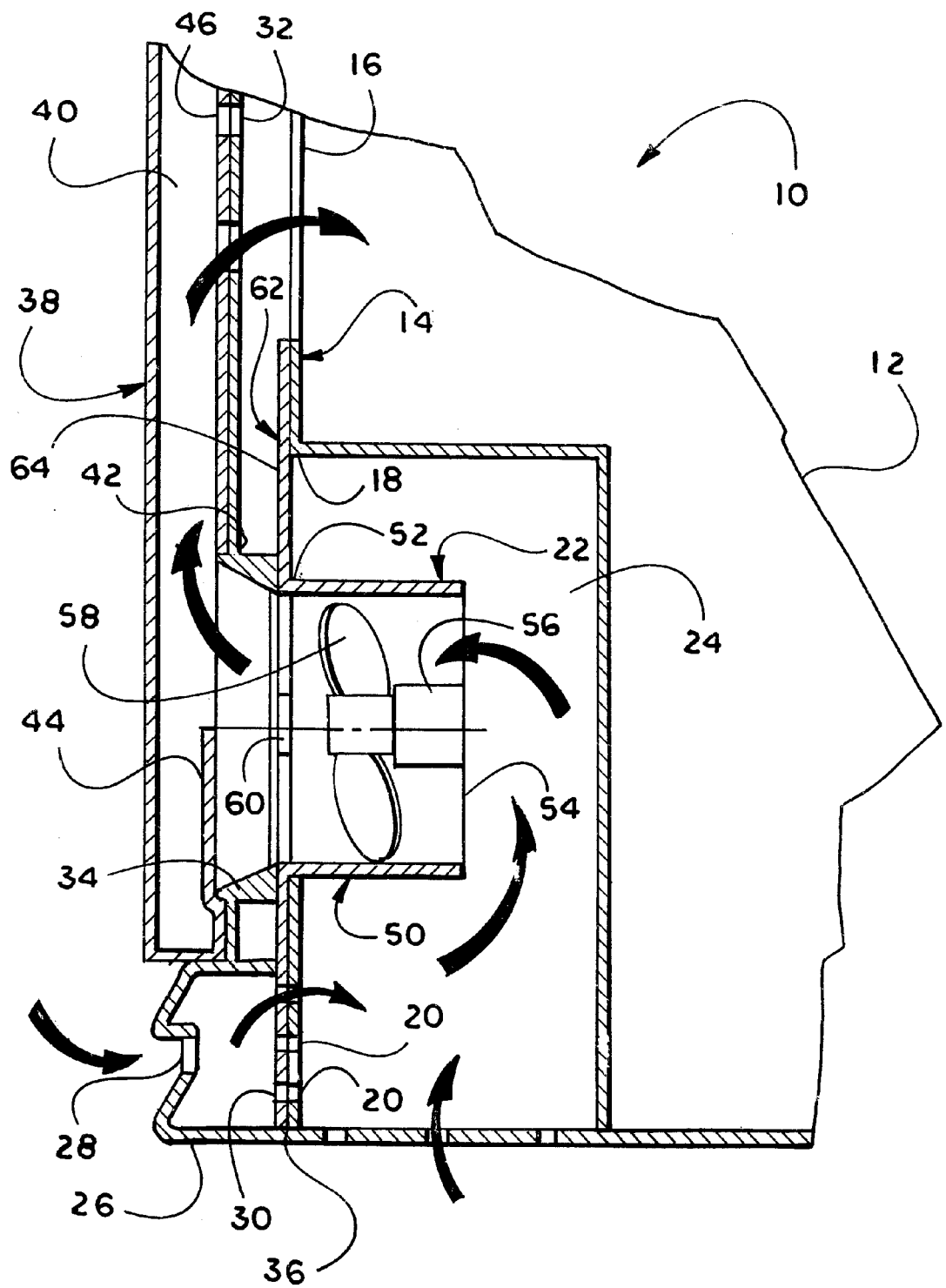
Fig_3

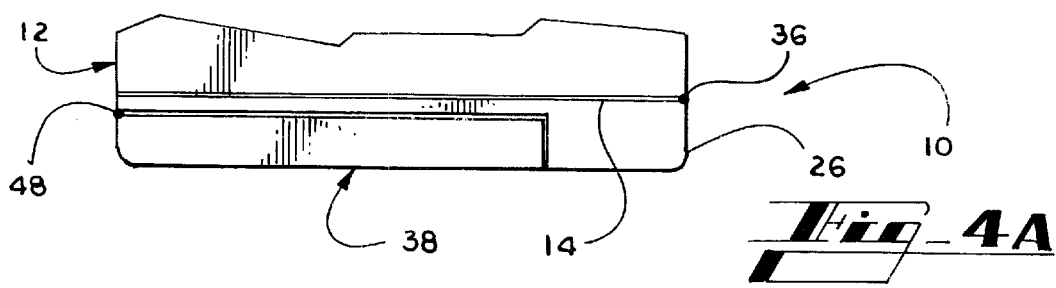
Fig. 4A
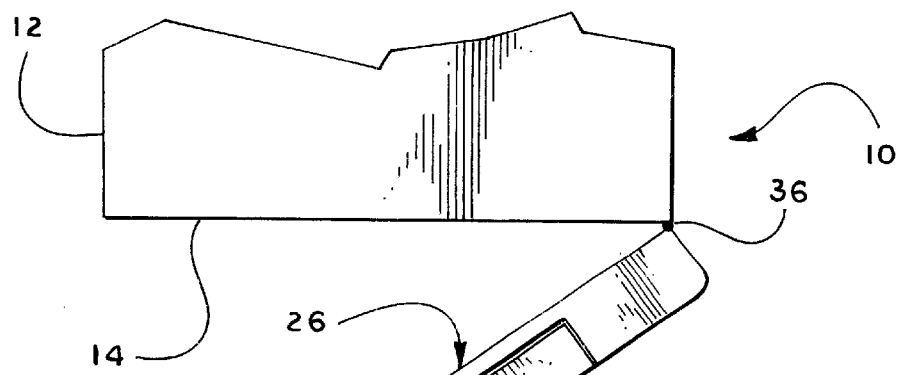
Fig. 4B
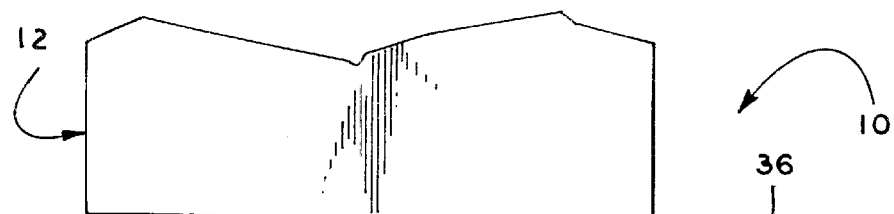
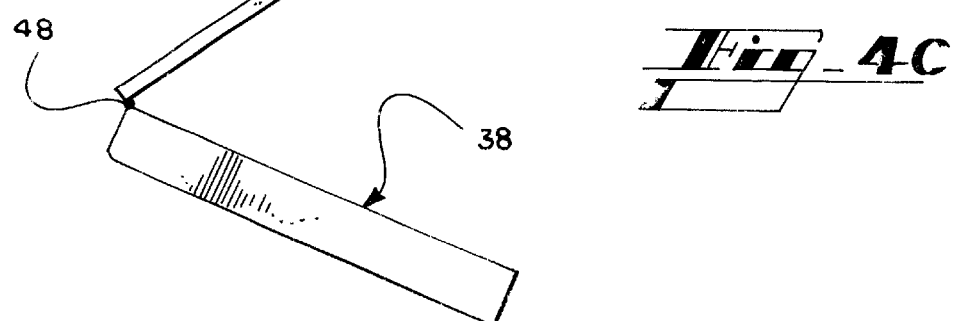
Fig. 4C

COMPUTER CABINET COOLING SYSTEM

BACKGROUND OF THE INVENTION

I. Field of the Invention

The present invention relates generally to the field of computer cooling fans. More particularly, the invention comprises a computer cabinet cooling system.

In general, a first field of use of the disclosed invention is by computer manufacturers as the most likely benefactors of the unique advantages of the instant invention. However, many other fields, such as for use by manufacturers of other heat producing electronic equipment and the like, could find potentially beneficial uses of this invention.

Thus, it can be seen that the potential fields of use for this invention are myriad and the particular preferred embodiments described herein is in no way meant to limit the use of the invention to the particular field chosen for exposition of the details of the invention.

A comprehensive listing of all the possible fields to which this invention may be applied is limited only by the imagination and is, therefore, not provided herein. Some of the more obvious applications are mentioned in the interest of providing a full and complete disclosure of the unique properties of this previously unknown general purpose article of manufacture. It is to be understood from the outset that the scope of this invention is not limited to these fields or to the specific examples of potential uses presented herein.

II. Description of the Related Art

Heat is the natural by-product of any electrical current flow. Some of the electricity in any circuit, except circuits made from superconductors, is turned into heat by the unavoidable electrical resistance of the circuit. Heat is also generated whenever an element of a computer circuit changes state. In fact, nearly all of the electricity consumed by a computer eventually turns into heat.

Inside the protective and confining cabinet of the computer, heat builds up, driving up the temperature. Heat is the worst energy of semiconductor circuits. It can shorten their lives considerably or even cause their catastrophic failure. Some means of escape must be provided for the excess heat. In truth, the heat build-up in most computers will not be immediately fatal to semiconductor circuits. For example, most microprocessors will shut down or simply generate errors that will shut down the computer before any permanent damage occurs to them or the rest of the components inside the computer. However, heat can cause circuits to age prematurely. It can trim the lives of circuit components. Keeping a system cool can thus prolong its life.

Computer cabinets have several front accessible bays into which various types of hardware may be placed. When hardware is placed in computer cabinets, especially computer cabinets that act as servers holding many hard drives, it is frequently difficult to cool the hard drives in any meaningful way. A typical computer cabinet will have multiple access openings in the front and back, and possibly on the bottom, with one or more fan units placed in the front or back panels to move the air therethrough. However, it is very difficult to move the air in this fashion and have it do meaningful cooling of hardware which is placed in a bay near the upper regions of the computer cabinet.

A wide range of configurations are known and are commercially available for computer systems, including desktop computers, servers, work stations, and the like. In general, such systems include a primary console or cabinet supporting and housing various system components, including a signal processor, memory circuitry, hard disk drives, floppy drives, CD ROM drives, power supplies, and so forth. During operation of the computer system, significant heat may be generated by the components, particularly by the signal processing circuitry and drives. To avoid excessive temperatures which could cause damage to the system components, it is commonplace to provide fans for drawing a flow of air into the through the console chassis to convectively cool the components.

Conventional fan cooling systems for computers typically include a small DC motor directly coupled to a rotary fan. Depending upon the cooling requirements, several such fans may be included, such as for directing a flow of cooling air over signal processing circuitry, as well as through power supply circuitry. Inlet apertures are provided in the chassis to facilitate the circulation of air over the circuit components. The motor and fan sets are generally supported by either external mounting structures, or by plates which are secured directly to an interior peripheral wall of the chassis or to mounting tabs within the chassis. When the system is operating, the fan motor is energized by the power supply to force the desired air flow over the circuit components. Control elements may also be included, such as thermistors, for regulating the speed of the fan based upon sensed temperature.

White such conventional cooling techniques do provide adequate cooling in many situations, they are not without a drawback. For example, conventional arrangements for cooling of the computer system components, such as CPUs, may not direct flow adequately over the circuitry, resulting in an unacceptable level of heating, particularly in warmer climates and higher altitudes.

In addition to the foregoing drawback, cooling systems for computer components often do not realize advantageous synergies between separate cooling structures within the systems. In particular, in addition to requiring cooling for signal processing circuitry and power supplies, many systems may require additional cooling for disk drives, floppy drives, CD drives, and so forth. Where such additional cooling is required, a supplementary cooling fan structure is generally provided. In certain known systems, this cooling fan assembly directs flow from an internal region of the chassis around the drives. However, the resulting flow rate of cooling air and the temperature difference across the drives may still remain insufficient for adequate cooling.

There is a need, therefore, for an improved technique for cooling components of computer systems housed within a system chassis. There is also a need for a cooling system capable of directing or orienting air flow to provide a more laminar stream and a direct path for cooling air both into and from cooling fans. Such a technique would advantageously afford additional cooling for system components such as drives. Accordingly, the invention a computer cabinet cooling system will overcome the shortcomings of the prior art.

SUMMARY OF THE INVENTION

In accordance with the present invention and the contemplated problems which have and continue to exist in this field, the present invention is a computer cabinet cooling system that consists of a standard type of upright tower cabinet having two accordion fold doors on the front thereof. The doors are hinged in such a way that the space in the outer door forms an air plenum. When the doors are shut, the airflow moves therethrough. The air is sucked into the cabinet by a fan unit through air inlet and outlet ports in the inner door and goes through the cabinet, into a fan plenum and is then forced forwardly through the fan plenum into the outer door air plenum and moves upwardly through the outer door air plenum and exits through the air ingress slots within the outer and inner doors in which the air ingress slots match up to various heat producing components in an equipment bay mounted within the computer cabinet front panel. The fan unit includes a plate which is affixed to the front panel of the computer cabinet, so that it can be easily removed for service. The invention is the multiple door assembly along with the various plenums and air ingress slots which allow the cooling air to be directed to the equipment bay through the front of the computer cabinet. This directional airflow appears to be unique.

The invention is simple, easy to use and is economical to manufacture. The invention provides improved elements and arrangements thereof in an apparatus for the purposes described which is inexpensive, dependable and fully effective in accomplishing its intended purposes.

Other objects, advantages and capabilities of the invention will become apparent from the following description taken in conjunction with the accompanying drawings showing the preferred embodiment of the invention.

BRIEF DESCRIPTION OF THE DRAWINGS

FIG. 3 is a longitudinal cross sectional view of a lower portion of the present invention with both the inner and outer doors closed together, showing the air flow therethrough;

FIG. 4A is a top view showing both the inner and outer doors closed and rear portion of the upright tower cabinet broken away;

FIG. 4B is a top view similar to FIG. 4A, showing both the inner and outer doors partly opened together; and FIG. 4C is a top view similar to FIG. 4B, showing the inner door partly opened and the outer door partly opened from the inner door.

DETAILED DESCRIPTION OF THE INVENTION

Figure 1:
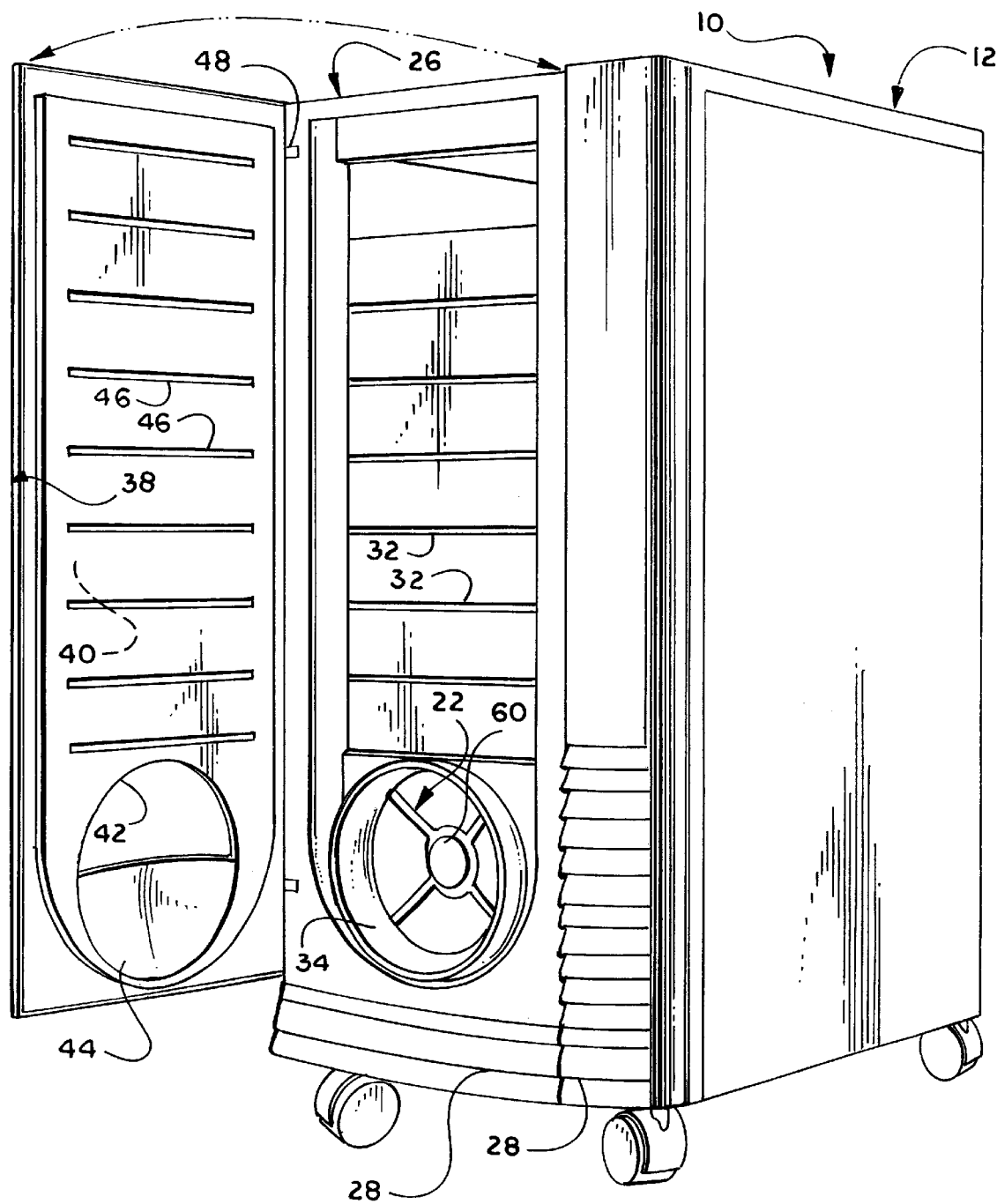
FIG. 1 shows a right side perspective view of the present invention with the outer door opened and the inner door closed.
Figure 2:
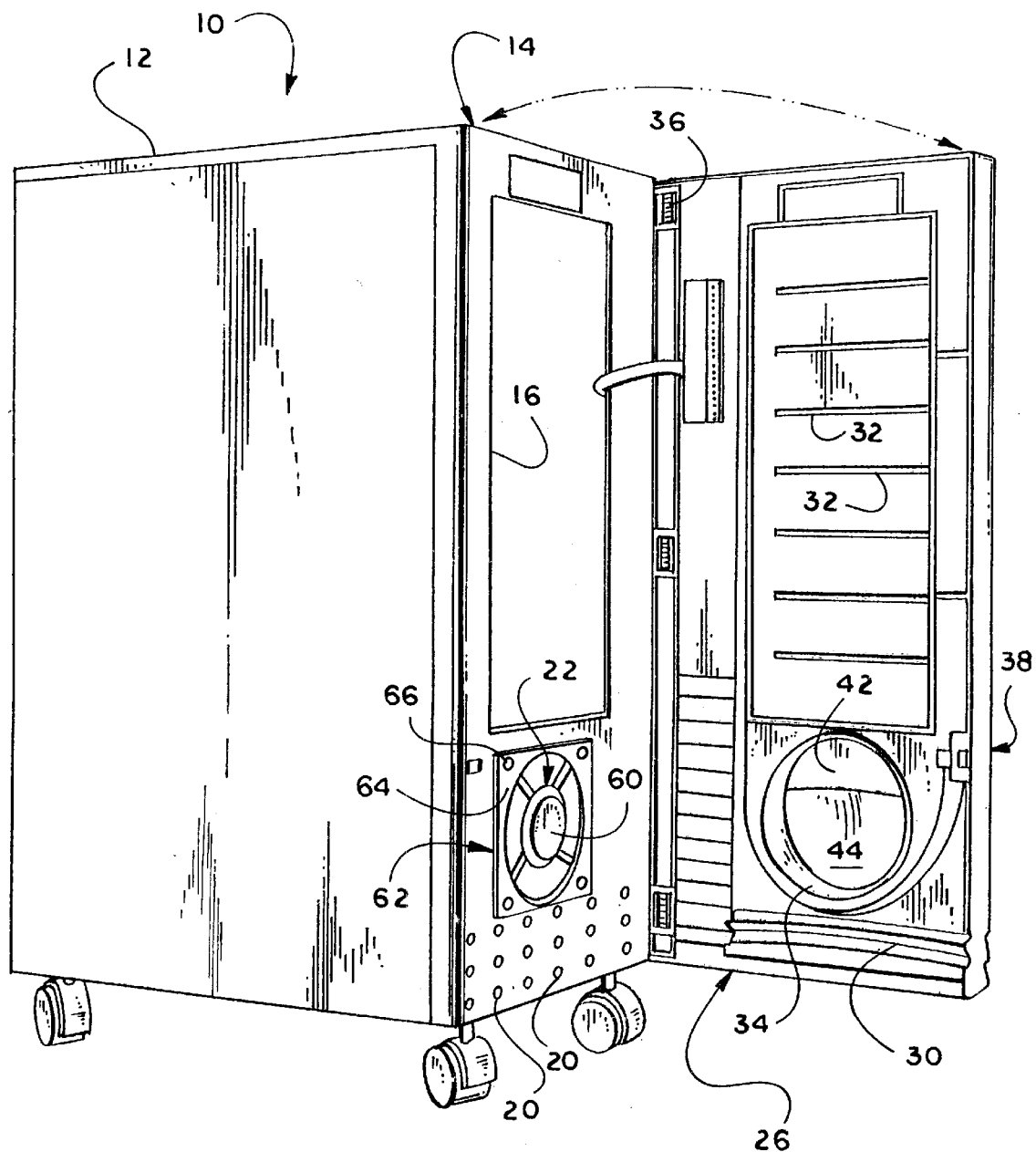
FIG. 2 is a left side perspective view of the present invention with both the inner and outer doors opened together.

Referring to the drawings wherein like reference numerals designate corresponding parts throughout the several figures, reference is made first to FIGS. 1 through 4C which illustrate various components of the present invention being a computer cabinet cooling system 10 comprising an upright tower cabinet 12 having a front panel 14 with an equipment bay 16 for holding heat producing components, a lower aperture 18 and a plurality of air openings 20. A fan unit 22 having a fan plenum 24 is mounted within lower aperture 18 of front panel 14 below equipment bay 16 near air openings 20. An inner door 26 is provided having a plurality of air inlet ports 28, a plurality of air outlet ports 30, a plurality of spaced apart horizontal air ingress slots 32 and a fan shroud 34. A plurality of hinges 36 are mounted between right side of inner door 26 and right side of front panel 14. When inner door 26 is closed against front panel 14, air outlet ports 30 will align with air openings 20 in front panel 14, air ingress slots 32 will align with heat producing components in equipment bay 16 and fan shroud 34 will contact fan unit 22.

An outer door 38 is also provided having an air plenum 40, a lower orifice 42 with air deflector 44, and a plurality of spaced apart horizontal air ingress slots 46. A plurality of hinges 48 are mounted between left side of inner door 26 and left side of outer door 38 in an accordion fashion. When outer door 38 is closed against inner door 26, lower orifice 42 with air deflector 44 will contact fan shroud 34 and air ingress slots 46 in outer door 38 will align with air ingress slots 32 in inner door 26. When fan unit 22 is turned on ambient air will be drawn through air inlet ports 28 and air outlets ports 30 in inner door 26, past air openings 20 in front panel 14, into fan plenum 24, out through fan shroud 34, past lower orifice 42 with air deflector 44 and up through air plenum 40 in outer door 38 through air ingress slots 46 in outer door 38 past air ingress slots 32 in inner door 26 and into equipment bay 16 in front panel 14 to cool the heat producing components in upright tower cabinet 12 (see FIG. 3).

Fan unit 22, as best seen in FIG. 3 includes a housing 50 having a front opening 52 and a rear opening 54 extending into fan plenum 24. An electric motor 56 is carried within housing 50. A fan blade 58 is rotatable by electric motor 56. A fan grill 60 is attached to front opening 52 of housing 50.

An assembly 62 removably mounts fan unit 22 into lower aperture 18 of front panel 14 of upright tower cabinet 12. When inner door 26 with outer door 38 are opened together, fan unit 22 can be easily removed for service and replacement. Mounting assembly 62 includes a plate 64 transversely affixed about front opening 52 of housing 50 about lower aperture 18. A plurality of fasteners 66 secure plate 64 in a removable manner to front panel 14 of upright tower cabinet 12.

Therefore, the foregoing is considered as illustrative only of the principles of the invention. Further, various modifications may be made of the invention without departing from the scope thereof and it is desired, therefore, that only such limitations shall be placed thereon as are imposed by the prior art and which are set forth in the appended claims.

What is claimed is:

1. A computer cabinet cooling system comprising:

an upright tower cabinet having a front panel with an equipment bay for holding heat producing components, a lower aperture and a plurality of air openings, a fan unit having a fan plenum mounted within said lower aperture of said front panel below said equipment bay near said air openings, an inner door having a plurality of air inlet ports, a plurality of air outlet ports, a plurality of spaced apart horizontal air ingress slots and a fan shroud, a plurality of hinges mounted between right side of said inner door and right side of said front panel, so that when said inner door is closed against said front panel, said air outlet ports will align with the heat producing components in said air openings in said front panel, said air ingress slots will align with said equipment bay and said fan shroud will contact said fan unit, an outer door having an air plenum, a lower orifice with air deflector, and a plurality of spaced apart horizontal air ingress slots, and a plurality of hinges mounted between left side of said inner door and left side of said outer door in an accordion fashion, so that when said outer door is closed against said inner door, said lower orifice with air deflector will contact said fan shroud and said air ingress slots in said outer door will align with said air ingress slots in said inner door, whereby when said fan unit is turned on ambient air will be drawn through said air inlet ports and said air outlet ports in said inner door, past said air openings in said front panel, into said fan plenum, out through said fan shroud, past said lower orifice with said air deflector and up through said air plenum in said outer door through said air ingress slots in said outer door past said air ingress slots in said inner door and into said equipment bay in said front panel to cool the heat producing components in said upright tower cabinet.

2. The computer cabinet cooling system as recited in claim 1, wherein said fan unit includes:

a housing having a front opening and a rear opening extending into said fan plenum, an electric motor carried within said housing, a fan blade rotatable by said electric motor, and a fan grill attached to said front opening of said housing.

3. The computer cabinet cooling system as recited in claim 2, further including means for removably mounting said fan unit into said lower aperture of said front panel of said upright tower cabinet, so that when said inner door with said outer door are opened together, said fan unit can be easily removed for service and replacement.

4. The computer cabinet cooling system as recited in claim 3, wherein said removably mounting means includes a plate transversely affixed about said front opening of said housing, and a plurality of fasteners for securing said plate in a removable manner to said front panel of said upright tower cabinet.

* * * * *